(12) United States Patent
Clark et al.

(10) Patent No.: US 7,541,832 B1
(45) Date of Patent: Jun. 2, 2009

(54) LOW POWER, RACE FREE PROGRAMMABLE LOGIC ARRAYS

(75) Inventors: Lawrence T. Clark, Phoenix, AZ (US); Giby Samson, Tempe, AZ (US)

(73) Assignee: Arizona Board of Regents for and on behalf of Arizona State University, Scottsdale, AZ (US)

( * ) Notice: Subject to any disclaimer, the term of this patent is extended or adjusted under 35 U.S.C. 154(b) by 126 days.

(21) Appl. No.: 11/742,060

(22) Filed: Apr. 30, 2007

(51) Int. Cl.
 *H03K 19/177* (2006.01)
(52) U.S. Cl. .............................. 326/37; 326/38; 326/39
(58) Field of Classification Search ............. 326/38–41; 716/17
 See application file for complete search history.

(56) References Cited

U.S. PATENT DOCUMENTS

| | | | | |
|---|---|---|---|---|
| 5,101,122 | A * | 3/1992 | Shinonara | 326/44 |
| 5,511,173 | A * | 4/1996 | Yamaura et al. | 712/248 |
| 6,127,838 | A * | 10/2000 | Sachdev | 326/16 |
| 6,229,338 | B1 * | 5/2001 | Coulman et al. | 326/41 |
| 6,433,577 | B1 * | 8/2002 | Wang et al. | 326/37 |
| 7,065,732 | B1 * | 6/2006 | Konrad et al. | 716/16 |
| 7,170,316 | B2 * | 1/2007 | Dhong et al. | 326/40 |
| 7,245,149 | B2 * | 7/2007 | Lee | 326/39 |

OTHER PUBLICATIONS

Wong, B. et al., Nano-CMOS Circuit and Physical Design, 2004, pp. 1-23, 342-351, 360-367, 370-381.

Alvandpour, Atila et al., "A Sub-130-nm Conditional Keeper Technique," IEEE Journal of Solid-State Circuits, May 2002, pp. 633-638, vol. 37, No. 5, IEEE.
Haigh, Jonathan R. et al., "A Low-Power 2.5-GHz 90-nm Level 1 Cache and Memory Management Unit," IEEE Journal of Solid-State Circuits, May 2005, pp. 1190-1199, vol. 40, No. 5, IEEE.
International Technology Roadmap for Semiconductors, 2005, pp. 1-26.
Johnson, Mark C. et al., "Leakage Control With Efficient Use of Transistor Stacks in Single Threshold CMOS," Proceedings of the 36th ACM/IEEE Conference on Design Automation, 1999, ACM.
Mudge, Trevor, "Power: A First-Class Architectural Design Constraint," Computer, Apr. 2001, pp. 52-58, IEEE.
Narendra, Siva et al., "Scaling of Stack Effect and its Application for Leakage Reduction," Proceedings of The International Symposium on Low Power Electronics and Design, Aug. 6-7, 2001, pp. 195-200, ACM.
Pileggi, L. et al., "Exploring Regular Fabrics to Optimize the Performance-Cost Trade-Off," Proceedings of the ACM/IEEE DAC, Jun. 2003, pp. 782-787, ACM.

(Continued)

*Primary Examiner*—Vibol Tan
(74) *Attorney, Agent, or Firm*—Withrow & Terranova, P.L.L.C.

(57) ABSTRACT

The present invention provides a PLA architecture where the AND plane is implemented with NAND logic. The OR plane may be implemented with various logic, but in one embodiment, the OR plane is implemented with NOR logic. The AND plane may have multiple sequential stages providing hierarchical NAND logic. The NAND logic may be broken into a hierarchy of NAND logic blocks. Each NAND logic block may include one or more series-connected NAND transistor stacks. Each transistor in the transistor stack may receive an input signal representing the product of a PLA clock signal and either a direct PLA input or the complement thereof. As such, the PLA clock is inherently integrated with the input signals that drive the various transistors of the NAND transistor stacks.

23 Claims, 12 Drawing Sheets

OTHER PUBLICATIONS

Kaushik, Roy et al., "Leakage Current Mechanisms and Leakage Reduction Techniques in Deep-Submicrometer CMOS Circuits," Proceedings of the IEEE, Feb. 2003, pp. 305-327, vol. 91, No. 2, IEEE.

Takahashi, O. et al., "The Circuits and Physical Design of the Synergistic Processor Element of a Cell Processor," Symposium on VLSI Circuits Digest of Technical Papers, 2005, pp. 20-23.

Wang, Jinn-Shyan et al., "Analysis and Design of High-Speed and Low-Power CMOS PLAs," IEEE Journal of Solid State Circuits, Aug. 2001, pp. 1250-1262, vol. 36, No. 8, IEEE.

Weste, N. et al., CMOS VLSI Design: A Circuits and Systems Perspective, 3rd edition, 2005, pp. 192, 194-196, 336-340, 750-756, Addison-Wesley, NY.

* cited by examiner

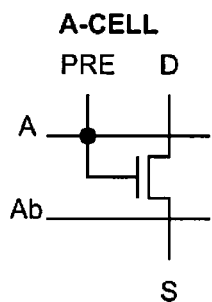
FIG. 9A  A-CELL
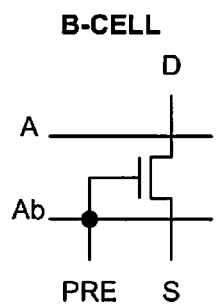
FIG. 9B  B-CELL
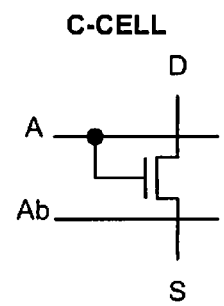
FIG. 9C  C-CELL
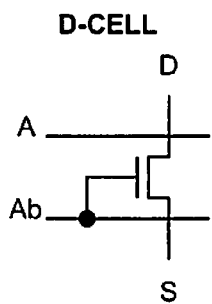
FIG. 9D  D-CELL
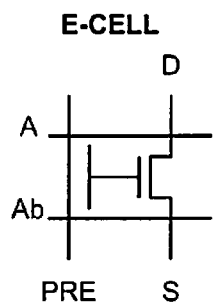
FIG. 9E  E-CELL
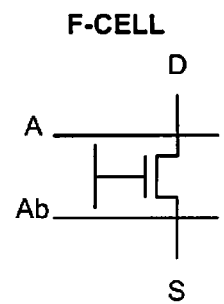
FIG. 9F  F-CELL
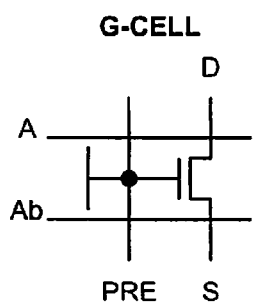
FIG. 9G  G-CELL
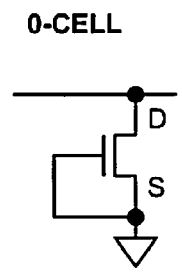
FIG. 9H  0-CELL
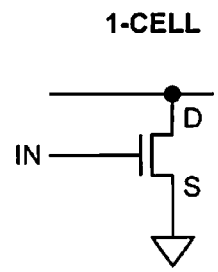
FIG. 9I  1-CELL

LOW POWER, RACE FREE PROGRAMMABLE LOGIC ARRAYS

FIELD OF THE INVENTION

The present invention relates to programmable logic arrays (PLAs), and in particular to low power PLAs that are free of potential timing races.

BACKGROUND OF THE INVENTION

Those skilled in the art will recognize that PLAs are generally broken into two planes. Input signals are presented to an AND plane, which determines the products of the input signals to generate product terms. The product terms are presented to the OR plane, which will determine the sum of the product terms that were provided by the AND plane. The output of the OR plane is latched for use by other circuitry or fed back into an input of the AND plane. Accordingly, PLAs provide a sum-of-products based on available inputs. Any logic function can be expressed in a sum-of-products form, wherein each output is the sum of products of true or complementary inputs.

Conventionally, dynamic NOR gates have been used to implement both the AND plane and the OR plane. Dynamic logic gates are gates that employ a clock signal to activate a logic function, as opposed to static logic gates, in which the output is merely a function of the inputs. When dynamic NOR gates are used to implement both the AND and OR planes, the PLA structure is referred to as a NOR-NOR PLA structure. A portion of a typical NOR-NOR PLA structure is illustrated in FIG. 1. Those skilled in the art will recognize that a typical PLA will have many more inputs, primary logic gates, and the like. The PLA includes an AND plane 12, as well as an OR plane 14. Input signals or their complements, $PLA_{IN(n)}$ are buffered by buffers 16 and presented to any number of NOR gates 18, wherein each NOR gate 18 effectively provides a logical NOR of select PLA input signals $PLA_{IN(n)}$. The output of each NOR gate 18 provides an OR plane input signal $OR_{IN(n)}$ to the OR plane 14.

Each of the NOR gates 18 in the AND plane 12 is driven by a main PLA clock $CLK_{PLA}$. The PLA clock $CLK_{PLA}$ also drives a specially configured NOR gate, which is referred to herein as a replica clock NOR gate 20. The replica clock NOR gate 20 receives the PLA clock $CLK_{PLA}$ and generates a replica clock $CLK_{REP}$ that is used to drive the OR plane 14, as will be described in greater detail below. The replica clock NOR gate 20 essentially provides a delayed version of the PLA clock $CLK_{PLA}$, wherein the delay is theoretically sufficient to allow each of the other NOR gates 18 to provide an appropriate output to the OR plane 14 before the replica clock $CLK_{REP}$ reaches the OR plane 14. As will be highlighted below, this race condition is subject to failure, which results in an improper PLA output signal $PLA_{OUT(x)}$. Prior to illustrating the race condition, an overview of the respective NOR gates 18 and replica clock NOR gate 20 is provided.

Each NOR gate 18 and replica clock NOR gate 20 includes a set of NMOS field effect transistors (FETs) connected in parallel to form an OR gate. The NMOS FETs of the OR gate are labeled $T_1$, $T_2$, and $T_3$, wherein the drains of each of the NMOS FETs $T_1$-$T_3$ are connected to form an OR node OR(n). The sources of the NMOS FETs $T_1$-$T_3$ are coupled to the drain of another NMOS transistor, which is referred to as a footer transistor $T_4$. The gates of the NMOS FETs $T_1$-$T_3$ of the OR gate are driven by different PLA input signals $PLA_{IN}$, while the gate of the footer transistor $T_4$ is driven by the PLA clock $CLK_{PLA}$. The source of the footer transistor $T_4$ is connected to ground. The OR node OR(n) is coupled to $V_{CC}$, which is represented by a horizontal bar, by a PMOS FET. This PMOS FET is referred to as a pre-charge transistor $T_5$. The gate of the pre-charge transistor $T_5$ is driven by the PLA clock $CLK_{PLA}$.

In operation, assume that the PLA clock $CLK_{PLA}$ is initially low, which will leave the footer transistor $T_4$ turned off and will turn on the pre-charged transistor $T_5$. As such, the OR node OR(n) goes high. In particular, the drains and associated capacitance associated with transistors $T_1$-$T_3$ are charged to allow the OR node OR(n) to go high when the pre-charge transistor $T_5$ turns on. Since the footer transistor $T_4$ is off, transistors $T_1$-$T_3$ are allowed to remain high regardless of the PLA input signal $PLA_{IN(n)}$ that is being presented to the respective gates of the transistors $T_1$-$T_3$.

When the PLA clock $CLK_{PLA}$ goes high, the pre-charge transistor $T_5$ will turn off, while the footer transistor $T_4$ turns on. Thus, the sources of transistors $T_1$-$T_3$ are pulled to ground while the OR node OR(n) remains charged. If any of the PLA input signals $PLA_{IN(n)}$ are high, the transistor $T_1$-$T_3$ to which the PLA input signal $PLA_{IN(n)}$ is connected will turn on, because the gate of that transistor $T_1$-$T_3$ will be high while the source is pulled to ground via the footer transistor $T_4$. Since the footer transistor $T_4$ is on, the OR node OR(n) can discharge through the one or more transistors $T_1$-$T_3$ that are on and the footer transistor $T_4$. As a result, the OR node OR(n) will transition from a high to a low. The signal on the OR node OR(n) is buffered by a buffer 22 in each of the NOR gates 18 to provide the OR plane input signal $OR_{IN(n)}$.

Another PMOS FET is coupled in parallel with the pre-charge transistor $T_5$ between the OR node OR(n) and $V_{CC}$. This PMOS FET is referred to as a keeper transistor $T_6$, whose gate is driven by an inverter 24 having an input that is coupled to the OR node OR(n). The keeper transistor $T_6$ is provided to maintain the charge on the OR node OR(n) when none of the PLA input signals $PLA_{IN(n)}$ are high. When any one of the PLA input signals $PLA_{IN(n)}$ is high, the OR node OR(n) is driven low, and the inverter 24 will drive the gate of the keeper transistor $T_6$ high, thus turning off the keeper transistor $T_6$ and allowing the OR node OR(n) to go low.

In a case where none of the PLA input signals $PLA_{IN(n)}$ are high, or in other words, all of the PLA input signals $PLA_{IN(n)}$ are low, transistors $T_1$-$T_3$ will not turn on, and the OR node OR(n) will remain high. When the OR node OR(n) is high, the inverter 24 will drive the gate of the keeper transistor $T_6$ low, thus turning on the keeper transistor $T_6$. As a result, the keeper transistor $T_6$ will maintain the OR node OR(n) high.

Thus, when the PLA clock $CLK_{PLA}$ is high, the OR node OR(n) is either a) kept high by the keeper transistor $T_6$, if none of the PLA input signals $PLA_{IN}$ are high, or b) discharged, if any of the PLA input signals $PLA_{IN}$ are high, through any of the transistors $T_1$-$T_3$ that are turned on and the footer transistor $T_4$. Again, the footer transistor $T_4$ is turned on when the PLA clock $CLK_{PLA}$ is high. When the PLA clock $CLK_{PLA}$ transitions from a high to a low, the footer transistor $T_4$ is turned off and the pre-charged transistor $T_5$ is turned on, thereby charging the OR node OR(n) to a high, wherein the process will repeat with each cycle of the PLA clock $CLK_{PLA}$.

As noted, the replica clock NOR gate 20 is essentially the same as the NOR gates 18, with the exception that at least one of the transistors $T_1$-$T_3$ that provides OR node OR(REP) is always on. Generally, one of the gates of transistors $T_1$-$T_3$ is tied high, while the gates of the remaining transistors $T_1$-$T_3$ are tied to ground. As illustrated, transistor $T_1$ is the transistor whose gate is tied high. The gates of transistors $T_2$ and $T_3$ are tied low. The goal of the replica clock NOR gate 20 is to impart a delay on the PLA clock $CLK_{PLA}$ before it is presented to the OR plane 14. To maximize this delay, the replica clock NOR gate 20 is configured to provide the slowest signal path for the PLA clock $CLK_{PLA}$. An inverter 26 is employed to provide additional delay and re-invert the PLA clock signal from the inversion provided by transistor $T_1$ and the footer transistor $T_4$ of the replica clock NOR gate 20. Because the gate of transistor $T_1$ is tied high, the OR node OR(REP) always discharges when the PLA clock $CLK_{PLA}$ transitions from a low to a high. The signal on the OR node OR(REP) is inverted by the inverter 26, buffered by the buffer 22, and presented to the OR plane 14 as the replica clock $CLK_{REP}$.

In operation, each of the OR nodes OR(n) of the NOR gates 18 has to discharge, if it is going to discharge, before the replica clock $CLK_{REP}$ goes high. If any OR node OR(n) of a NOR gate 18 discharges after the replica clock $CLK_{REP}$ goes high, there will be a failure of the PLA. An analysis of the OR plane 14 will illustrate why it is important to ensure that the replica clock $CLK_{REP}$ is asserted high after all of the OR nodes OR(n) of all the NOR gates 18 have discharged, if they are going to discharge.

As illustrated, the OR plane 14 includes a NOR gate 28, which like the NOR gates 18, includes a series of NMOS transistors $T_7$ and $T_8$, which are connected in parallel. The drains of the transistors $T_7$ and $T_8$ are coupled to form an output node $OR_{OUT(x)}$. The gates of the transistors $T_7$ and $T_8$ are driven by the outputs of corresponding NOR gates 18. The sources of the transistors $T_7$ and $T_8$ are coupled to the drain of a footer transistor $T_9$. The gate of footer transistor $T_9$ is driven by the replica clock $CLK_{REP}$. When the replica clock $CLK_{REP}$ goes high, the sources of the transistors $T_7$ and $T_8$ are pulled low, thereby enabling the input signals $OR_{IN(n)}$ from the NOR gates 18 to be processed by transistors $T_7$ and $T_8$. If any of the OR plane input signals $OR_{IN(n)}$ are high while the replica clock $CLK_{REP}$ is high, the output node $OR_{OUT(x)}$ will go low and be latched by an output latch 30 to provide the PLA output signal $PLA_{OUT(x)}$.

With reference to FIG. 2, a timing diagram is illustrated, where each of the OR plane input signals $OR_{IN(n)}$ goes low, if they are going low, before the replica clock $CLK_{REP}$ goes high. In this instance, the OR plane input nodes $OR_{IN(n)}$ go low at time $t_1$, and the replica clock $CLK_{REP}$ subsequently goes high at time $t_2$. In this instance, the OR plane output node $OR_{OUT(x)}$ remains charged high, which results in the PLA output signal $PLA_{OUT(x)}$ being properly latched. Notably, the OR plane output node $OR_{OUT(x)}$ is normally charged high using pre-charge circuitry, which is not illustrated, but may be similar to that employed by the NOR gates 18 in the AND plane 12.

Turning now to FIG. 3, a timing diagram is illustrated wherein the replica clock $CLK_{REP}$ goes high at time $t_1$ before the OR plane input signal $OR_{IN(n)}$ goes low at time $t_3$. When the replica clock $CLK_{REP}$ goes high and one of the OR plane input signals $OR_{IN(n)}$ has not yet transitioned from a high to a low, the gate of one of the transistors $T_7$ and $T_8$ is driven high. The source of the corresponding transistor $T_7$ or $T_8$ is pulled low through the footer transistor $T_9$ in response to the replica clock $CLK_{REP}$ going high. As such, the OR plane output node $OR_{OUT(x)}$ is improperly discharged, which will result in the OR plane output node $OR_{OUT(x)}$ going low at time $t_2$ and being latched to provide an improper PLA output signal $PLA_{OUT(x)}$.

As PLAs grow larger and operating speed increase, the race condition between the arrival of the replica clock $CLK_{REP}$ and the OR plane input signals $OR_{IN(n)}$ at the NOR gate 28 of the OR plane 14 becomes more unpredictable. As seen from the above, the speed of the NOR gates 18 of the AND plane 12 may vary based on how fast the OR node OR(n) discharges. The speed at which the OR node OR(n) discharges will vary based on the PLA input signals $PLA_{IN(n)}$. When process and temperature variables are also factored in, designers reach a point where it is virtually impossible to design a stable and reliable PLA employing a NOR-NOR PLA structure, which will always avoid failures due to the replica clock $CLK_{REP}$ arriving at the OR plane 14 prior to the OR plane input signals $OR_{IN(n)}$. As such, there is a need for a PLA architecture that avoids this potential race condition, regardless of scale, operating speeds, or input conditions.

Another issue associated with NOR-NOR PLA structures is the amount of leakage current required to charge the OR node OR(n) and maintain a charge on the OR node OR(n) when the PLA clock $CLK_{PLA}$ is asserted high and all of the PLA input signals $PLA_{IN(n)}$ are low. As the number of transistors $T_1$-$T_3$ in a given NOR gate 18 increases, the size of the keeper transistor $T_6$, as well as the pre-charge transistor $T_5$, must increase to supply sufficient current to charge and maintain a charge on the OR node OR(n). Once the leakage current in a NOR gate 18 reaches a certain level, the keeper transistor $T_6$ will be insufficient to supply enough leakage current, or the keeper circuit will require more than one pull down transistor to provide sufficient leakage current.

Accordingly, there also is a need for a PLA structure that significantly reduces the leakage current associated with charging and maintaining a charge on the OR nodes OR(n) within the AND plane 12. In certain applications, there is a further need to reduce the leakage current associated with maintaining a charge on the OR plane output node $OR_{OUT(x)}$ in the OR plane 14.

SUMMARY OF THE INVENTION

The present invention provides a PLA architecture where the AND plane is implemented with NAND logic. The OR plane may be implemented with various logic, but in one embodiment, the OR plane is implemented with NOR logic. The AND plane may have multiple sequential stages providing hierarchical NAND logic. The NAND logic may be broken into a hierarchy of NAND logic blocks. Each NAND logic block may include one or more series-connected NAND transistor stacks. Each transistor in the transistor stack may receive an input signal representing the product of a PLA clock signal and either a direct PLA input or the complement thereof. As such, the PLA clock is inherently integrated with the input signals that drive the various transistors of the NAND transistor stacks.

The NAND transistor stacks are generally coupled between a NAND node and ground, wherein the NAND node is pre-charged using pre-charge circuitry. In one embodiment, the pre-charge circuitry is driven by the same signal that is used to drive one of the transistors in the NAND transistor stack. Preferably, the transistor at the top of the NAND transistor stack, which is therefore coupled to the NAND node, is the transistor whose input also drives the pre-charge circuitry. The pre-charge circuitry is activated when the NAND stack is not asserted. This generally corresponds to times when the PLA clock is not asserted.

The AND plane output signals may directly drive the OR plane. In particular, the AND plane output signals may drive the inputs of transistors coupled between an OR plane output node and ground. In an alternative embodiment, a series-connected stack of transistors is coupled between the OR plane output node and ground. The AND plane is broken into multiple sections, wherein the output of each section may be used to drive a different transistor in the transistor stack of the OR plane. As such, the AND plane output signals from multiple sections may need to be asserted prior to effecting a change in state at the output node of the OR plane.

The combination of the PLA architecture of the present invention and embedding the PLA clock into the AND plane input signals effectively removes any race conditions, which would result in a fault in the OR plane and thus a fault in the output of the PLA. The present invention also reduces power consumption relative to the PLA architectures of the prior art. In particular, the use of series-connected transistor stacks in the NAND blocks of the AND plane, and perhaps in the transistor stacks of the OR plane, minimizes the amount of leakage current and hence the keeper current necessary to maintain various nodes in the AND and OR planes at high levels. Further, the use of NAND logic in the AND plane may result in the AND plane looking like a large AND gate. As such, an assertion from the AND plane is asserted from a normally low state to a high state, saving further power.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

FIGS. 9A-9I illustrate various sub-cells used for constructing transistor stacks in the AND and OR planes according to one embodiment of the present invention.

DETAILED DESCRIPTION OF THE PREFERRED EMBODIMENTS

Figure 1:
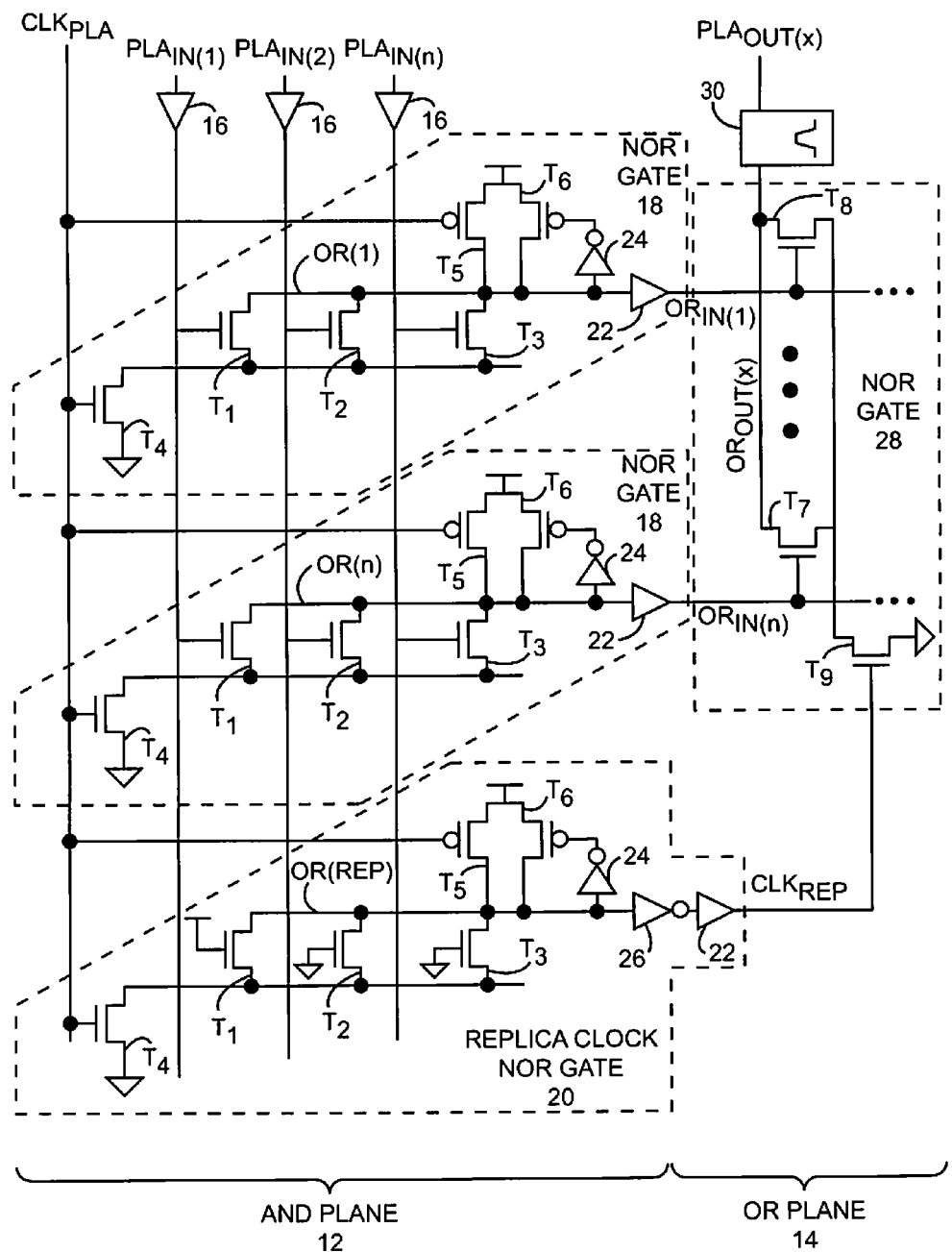
FIG. 1 illustrates a NOR-NOR PLA structure according to the prior art.
Figure 2:
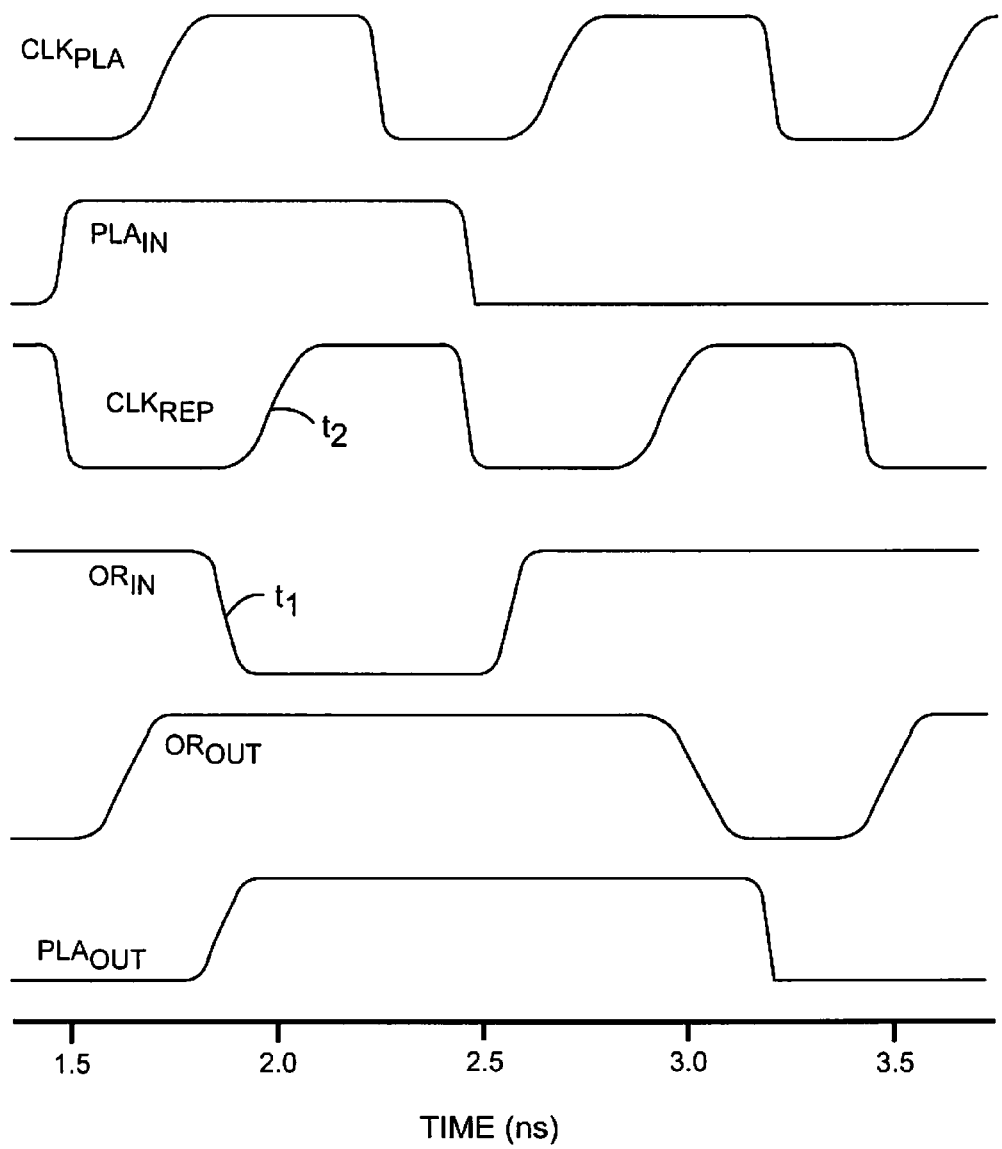
FIG. 2 is a timing diagram illustrating correct operation of the NOR-NOR PLA structure.
Figure 3:
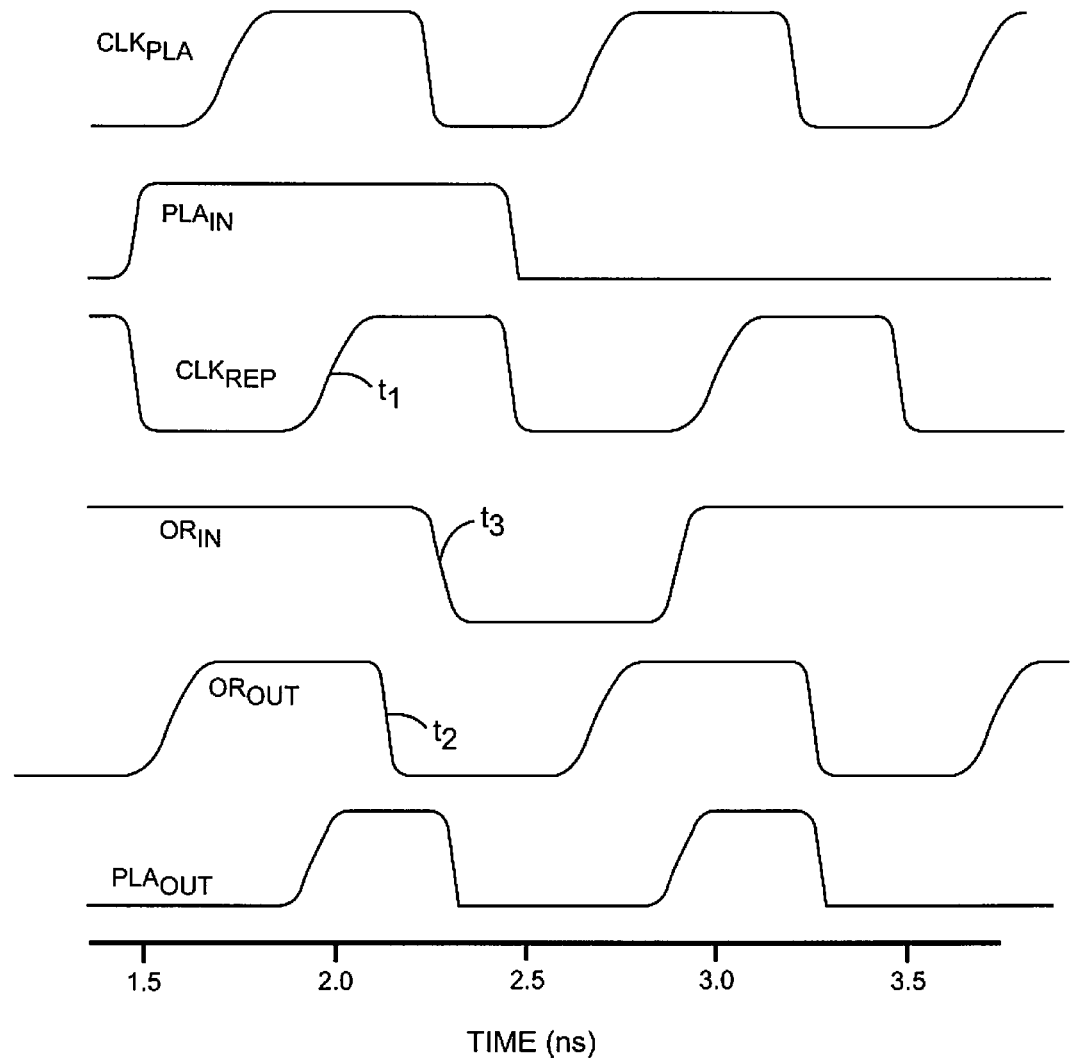
FIG. 3 is a timing diagram illustrating incorrect operation of the NOR-NOR PLA structure, wherein the circuit failure is due to a race condition.

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention provides a PLA architecture that avoids the race condition and excessive leakage current of the prior art, especially relative to NOR-NOR PLA structures. In contrast to the prior art, the present invention provides a NAND-NOR PLA structure. A logical representation of a portion of an exemplary NAND-NOR PLA structure is provided in FIG. 4 according to one embodiment of the present invention. Like other PLA architectures, an AND plane 32 and an OR plane 34 provide the foundation for the PLA structure. However, the AND plane 32 provides a dynamic NAND structure, while the OR plane 34 provides a dynamic NOR structure. The AND plane 32 may include any number of consecutive stages, wherein the output of one stage provides an input to a subsequent stage. As illustrated, the AND plane 32 includes a first stage 36 followed by a second stage 38. The output of the second stage 38 drives the OR plane 34.

The first stage 36 includes multiple dual NAND blocks 40, which are dynamic and in parallel with one another, and drive one or more dual NAND blocks 40' in the second stage 38. As those skilled in the art will recognize, this hierarchical use of parallel dual NAND blocks 40, 40' in the various stages provides a flexible architecture for scaling the PLA to various sizes, as well as implementing various logical functions.

The input signals $PLA_{IN(n)}$ are provided to the various dual NAND blocks 40 in the first stage 36. As illustrated, the PLA input signal $PLA'_{IN(n)}$ represents an actual input signal or its complement. In this embodiment, each dual NAND block 40 is capable of receiving eight PLA input signals $PLA'_{IN(n)}$. In the exploded dual NAND block 40, each of the PLA input signals $PLA'_{IN(1-8)}$ is delivered to one input of a dual input AND gate 42. The other input of the dual input AND gate 42 receives the PLA clock signal $CLK_{PLA}$. As such, each input or its complement that is provided to the first stage 36 is ANDED with the PLA clock $CLK_{PLA}$. Half of the dual input AND gates 42 drive a top NAND stack 44, while the other half of the dual input AND gates 42 drive a bottom NAND stack 46. The top and bottom NAND stacks 44, 46 each includes four FETs coupled in series between an input of a dual input NOR gate 48 and ground. In particular, the top NAND stack 44 includes NMOS FETs $T_{10}$, $T_{11}$, $T_{12}$, and $T_{13}$, whereas the bottom NAND stack 46 includes NMOS FETs $T_{14}$, $T_{15}$, $T_{16}$, and $T_{17}$.

For simplicity, the first input of the dual input NOR gate 48 is referred to as NAND node N1, and the second input of the dual input NOR gate 48 is referred to as NAND node N2. Thus, transistors $T_{10}$-$T_{13}$ of the top NAND stack 44 are coupled in series between NAND node N1 and ground. Similarly, transistors $T_{14}$-$T_{17}$ are coupled in series between NAND node N2 and ground for the bottom NAND stack 46. Each NAND stack 44, 46 provides a logical NAND function and can include any number of series-connected transistors. Using the top NAND stack 44 as an example, assume that NAND node N1 is normally high. If the output of each of the dual input AND gates 42, which receive the PLA input signals $PLA'_{IN(1-4)}$, drive the gates of transistors $T_{10}$-$T_{13}$ high, the NAND node N1 will be driven low. Otherwise, NAND node N1 will remain high. As such, the outputs of each of the four dual input AND gates 42 that drive the top NAND stack 44 must go high in order to pull the NAND node N1 low, thereby providing a NAND function.

The NAND nodes N1, N2 are pre-charged high using PMOS FETs $T_{18}$ and $T_{19}$, respectively. The gates of the PMOS transistors $T_{18}$ and $T_{19}$ may be driven from an output of one of the dual input AND gates 42 that is associated with the top or bottom NAND stack 44, 46. Notably, the pre-charged transistors $T_{18}$ and $T_{19}$ are not driven by a separate clock signal. Instead, the pre-charge transistors $T_{18}$ and $T_{19}$ are effectively driven by the PLA input signals $PLA'_{IN(n)}$, which already have the PLA clock signal $CLK_{PLA}$ ANDED with them. Thus, when the PLA clock $CLK_{PLA}$ goes low, all of the outputs of the dual input AND gates 42 go low, and one of the outputs of the dual input AND gates 42 will drive a corresponding pre-charged transistor $T_{18}$ or $T_{19}$ low. As a result, the NAND nodes N1 and N2 are charged and pulled high.

The NAND nodes N1, N2 are also associated with a keeper circuit formed by inverters 50 and PMOS pre-charge transistors $T_{20}$ and $T_{21}$, respectively. To maintain the NAND nodes N1, N2 at a high level when the top or bottom NAND stack 44, 46 is not pulling the NAND nodes N1, N2 low, the high levels of the NAND nodes N1, N2 are maintained by the keeper circuitry. The keeper circuitry functions by inverting the high on the NAND node N1 or N2 with the corresponding inverter 50, thereby driving the gate of transistor $T_{20}$ or $T_{21}$ low. The result is that the keeper transistors $T_{20}$ and $T_{21}$ maintain the respective NAND nodes N1 and N2 high. If either of the top and bottom NAND stacks 44, 46 is active wherein each of the transistors $T_{10}$-$T_{13}$ or $T_{14}$-$T_{17}$, respectively, are turned on, the corresponding NAND node N1 or N2 is pulled low, wherein the inverters 50 will drive the gates of the keeper transistors $T_{20}$ or $T_{21}$ high, thereby turning the keeper transistors $T_{20}$ and $T_{21}$ off to allow NAND node N1 or N2 to transition to a low.

With the present invention, each dual NAND block 40 will receive a PLA input or its complement, which is ANDED with the PLA clock $CLK_{PLA}$ and used to drive a transistor $T_{10}$-$T_{17}$ in a top or bottom NAND stack 44, 46. The logic states appearing on the NAND nodes N1 and N2 are NORED by NOR gate 48 to drive a dual NAND block 40' in the second stage 38 of the AND plane 32. The dual NAND block 40' of the second stage 38 will include top and bottom NAND stacks, which are not individually referenced. As depicted, the transistors $T_{22}$ and $T_{23}$ would make up a top NAND stack for the dual NAND block 40', wherein transistor $T_{24}$ and other series-connected transistors would form a bottom NAND stack in the dual NAND block 40'. The number of transistors in the NAND stack for the dual NAND block 40' will depend on the number of associated dual NAND blocks 40 in the first stage 36 or the AND plane 32.

As with the first stage 36, NAND nodes N3 and N4 are connected to the respective top and bottom NAND stacks of the dual NAND block 40' in the second stage 38. The top NAND stack is connected between NAND node N3 and ground, whereas the bottom NAND stack is connected between NAND node N4 and ground. Pre-charged transistors $T_{26}$ and $T_{28}$ are coupled to the NAND nodes N3 and N4, to pre-charge the NAND nodes N3 and N4 to high when the transistors within the respective top and bottom NAND stacks are off. As depicted, the gates of the pre-charged transistors $T_{26}$ and $T_{28}$ may be driven with the same signal used to drive one of the transistors in corresponding top or bottom NAND stacks of the dual NAND block 40'. As depicted, the "top" transistors $T_{23}$ and $T_{24}$ are driven by the same signals used to drive the pre-charge transistors $T_{26}$ and $T_{28}$, respectively. Notably, the pre-charged transistors $T_{26}$ and $T_{28}$ are effectively driven by the PLA input signals $PLA'_{IN(n)}$, which already have the PLA clock $CLK_{PLA}$ ANDED therein. Thus, when the PLA clock $CLK_{PLA}$ goes low, the gates of the respective pre-charged transistors $T_{26}$ and $T_{28}$ will be driven low, thereby pulling the NAND nodes N3 and N4 high.

The NAND nodes N3 and N4 may also include keeper circuitry to maintain the NAND nodes N3 and N4 high when the corresponding top and bottom NAND stacks are not asserted low. Inverters 56 will drive the gates of the respective keeper transistors $T_{30}$ and $T_{32}$ low to effectively pull the NAND nodes N3 and N4 high when the top or bottom NAND stack is not asserted. Assuming the second stage 38 is the final stage of the AND plane 32, the output of the NOR gate 52 is buffered by a buffer 54 and represents an output of the AND plane 32. This output is also the input of the OR plane 34, and will be referenced as the AND plane output signal $AND_{OUT}$. Those skilled in the art will recognize that although one dual NAND block 40' in the second stage 38 is illustrated, numerous dual NAND blocks 40' will provide AND plane output signals $AND_{OUT}$.

The AND plane output signals $AND_{OUT}$ are used to drive the gates of NMOS FETs $T_{34}$ and $T_{36}$, which effectively provide a dynamic NOR gate 58 in the OR plane 34. In this embodiment, there is no footer transistor connected to the sources of these transistors $T_{34}$ and $T_{36}$. Transistors $T_{34}$, $T_{36}$ have their drains coupled together to form an OR node $OR_{OUT(x)}$, while the sources of transistors $T_{34}$, $T_{36}$ are coupled to ground. In operation, if any AND plane output signal $AND_{OUT}$ is high, the corresponding transistor $T_{34}$, $T_{36}$ of the NOR gate 58 is turned on, thereby driving the OR node $OR_{OUT(x)}$ low to facilitate a logical NOR function. Notably, no replica clock is required to drive the transistor core of the NOR gate 58. Instead, the PLA clock is embedded in the AND plane output signal $AND_{OUT}$, because the original input signals or the complements thereof were ANDED together. As will be seen below, by ANDING the input signals or their complements with the PLA clock $CLK_{PLA}$ in a NAND-NOR PLA structure, race conditions are avoided. The output node $OR_{OUT(x)}$ is effectively the output of the NOR gate 58 and is latched by a latch 60 to provide a PLA output signal $PLA_{OUT(x)}$.

Since the output node $OR_{OUT(x)}$ of the NOR gate 58 is normally high until one of the transistors $T_{34}$, $T_{36}$ is turned on to pull the output node $OR_{OUT(x)}$ low, a keeper circuit is employed to maintain the output node $OR_{OUT(x)}$ high when the transistors $T_{34}$, $T_{36}$ are off. Similar to the operation of the keeper circuits described above, an inverter 62 inverts the level provided by the output node $OR_{OUT(x)}$ to drive the gate of a PMOS keeper transistor $T_{38}$. When the output node $OR_{OUT(x)}$ is charged high, the output of the inverter 62 drives the gate of the keeper transistor $T_{38}$ low, thereby maintaining the output node $OR_{OUT(x)}$ high.

The output node $OR_{OUT(x)}$ is pre-charged high by a PMOS pre-charge transistor $T_{40}$. Before one of the AND plane output signals $AND_{OUT}$ goes high to turn one of the corresponding transistors $T_{34}$ and $T_{36}$ on, the gate of the pre-charge transistor $T_{40}$ is driven low, thereby charging the output node $OR_{OUT(x)}$ high. A pre-charge clock signal $CLK_{PC}$, which may be derived from the PLA clock $CLK_{PLA}$, is NORED with the output node $OR_{OUT(x)}$ by NOR gate 64 and inverted by an inverter 66 to drive the pre-charge transistor $T_{40}$. When the pre-charge clock $CLK_{PC}$ is low and the output node $OR_{OUT(x)}$ is low, the NOR gate 64 will drive the input of the inverter 66 high, which will result in the gate of the pre-charge transistor $T_{40}$ being driven low to charge the output node $OR_{OUT(x)}$ high. This will occur after a low on the output node $OR_{OUT(x)}$ has been latched by the latch 60 as the PLA output signal $PLA_{OUT(x)}$. Preferably, the latch 60 is triggered to open after the output node $OR_{OUT(x)}$ has the value to be latched.

From the above, those skilled in the art will recognize that the AND plane 32 actually operates as one large AND gate. As such, the output of the AND gate, which is the AND plane output signal $AND_{OUT}$, will only go high if the output of the AND plane 32 is supposed to go high. Since the AND plane output signal $AND_{OUT}$ only goes high when it is supposed to go high, the transition from a low to a high provides both a clock signal to the OR plane 34 and the output of the AND plane 32. As such, there is no race between a clock signal, such as the replica clock $CLK_{REP}$, and the AND plane output signal $AND_{OUT}$ as is present in the NOR-NOR PLA structures of the prior art. Again, this is because of the configuration of the AND plane 32 and the fact that the clock signal is initially ANDED with the PLA inputs (actual or complement) $PLA'_{IN(n)}$. Those skilled in the art should appreciate the significant benefit of providing an implicit clock in the AND plane output signals $AND_{OUT}$ to avoid race conditions.

Figure 5:
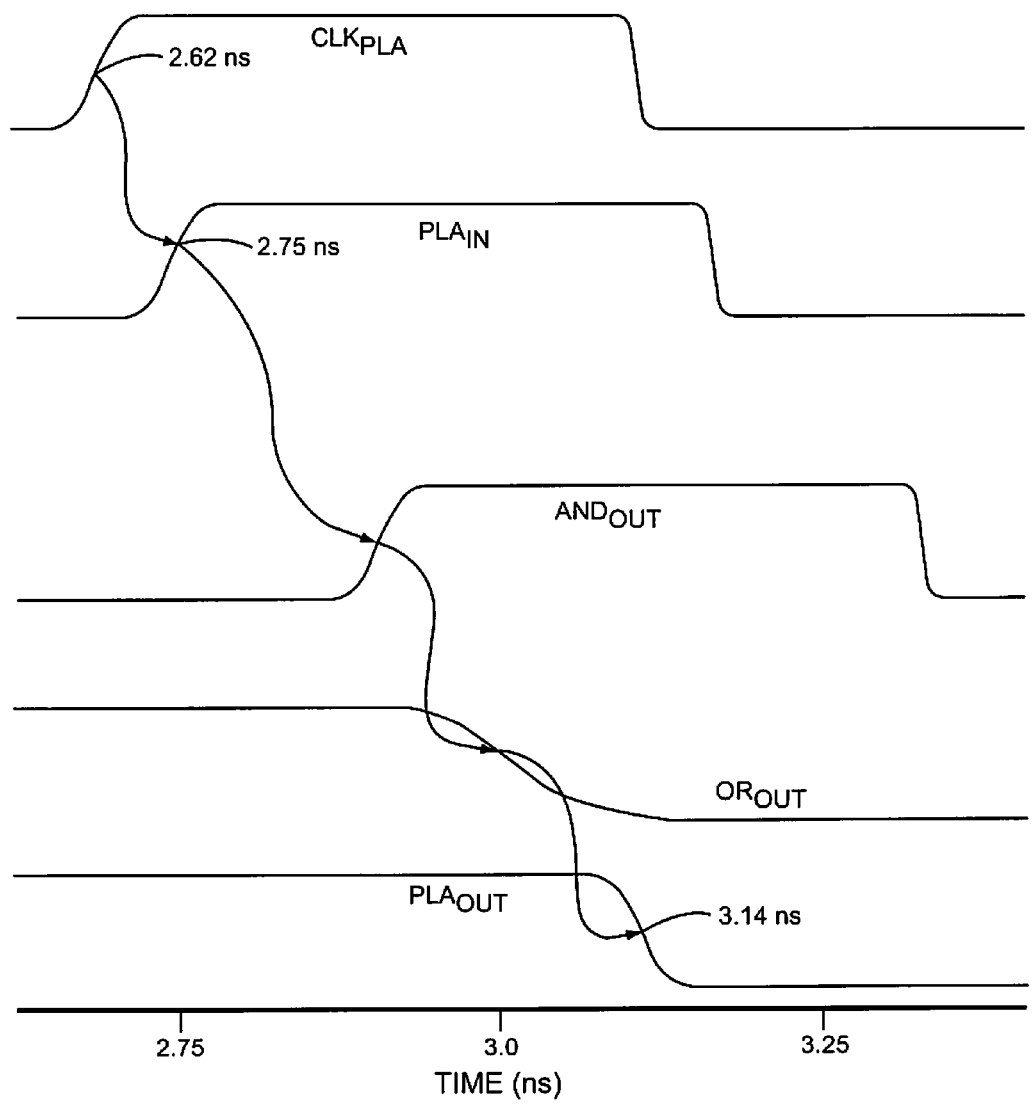
FIG. 5 is a timing diagram illustrating operation of the NAND-NOR PLA structure of FIG. 4.

With reference to FIG. 5, a timing diagram is provided to further illustrate how the present invention eliminates the possibility of a critical timing race. In this example, input signal $PLA_{IN}$ transitions to a high after the PLA clock input $CLK_{PLA}$ has transitioned high, thereby causing the AND plane output signal $AND_{OUT}$ to transition high. When the AND plane output signal $AND_{OUT}$ transitions high, the output node $OR_{OUT}$ of the NOR gate 58 in the OR plane 34 will begin to discharge, which will cause the PLA output signal $PLA_{OUT}$ to transition low. This result occurs without a need for a separate replica clock to control the output node $OR_{OUT}$ of the NOR gate 58, and as such, there cannot be a timing race, because there is no clock signal with which the AND plane output signal $AND_{OUT}$ may race.

Figure 4:
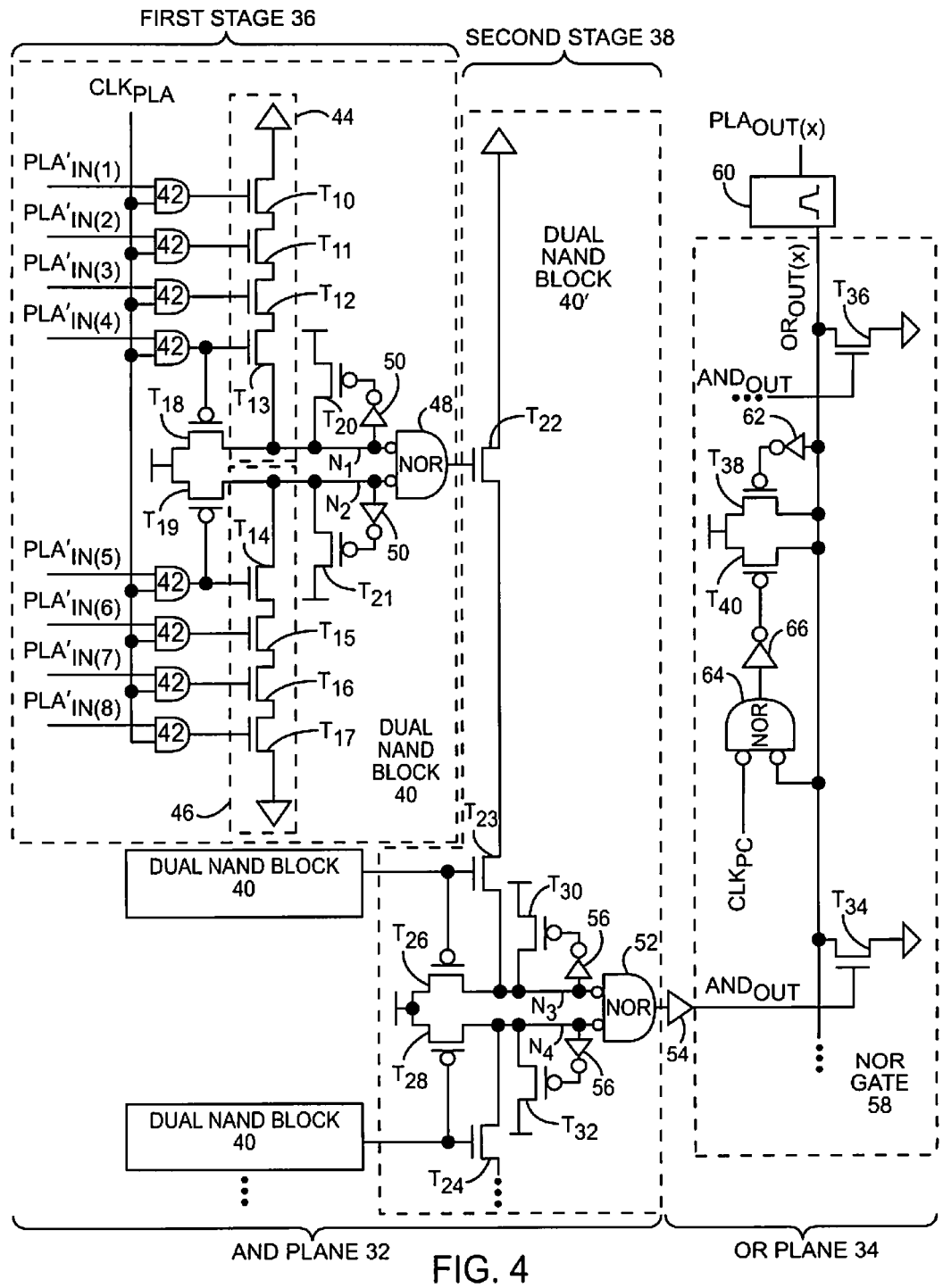
FIG. 4 illustrates a NAND-NOR PLA structure according to a first embodiment of the present invention.

The PLA architecture of FIG. 4 also significantly reduces leakage current associated with maintaining various nodes at a logic high. In each of the dual NAND blocks 40, the series configuration of the transistors in the top and bottom NAND stacks 44, 46 effectively allows the same leakage current to charge all of the transistors that are connected in series. Thus, instead of having X number of parallel transistors that would have X times the leakage current for a single transistor, any group of series-connected transistors only require the leakage current of a single transistor. The same principles apply in the series-connected transistor stacks in the dual NAND blocks 40' in the second stage 38. The leakage current is actually less than that of a single transistor.

Not only does reducing the leakage current reduce power consumption, but it also allows for a smaller keeper transistor, such as keeper transistors $T_{20}$, $T_{21}$, $T_{30}$, and $T_{32}$, to provide the necessary leakage current to maintain the corresponding NAND nodes N1, N2, N3, and N4 high. In the OR plane 34, since there is no need for a replica clock to control the primary function of the NOR gate 58, there is no need for a footer transistor coupled to the sources of the transistors $T_{34}$ and $T_{36}$.

Figure 6:
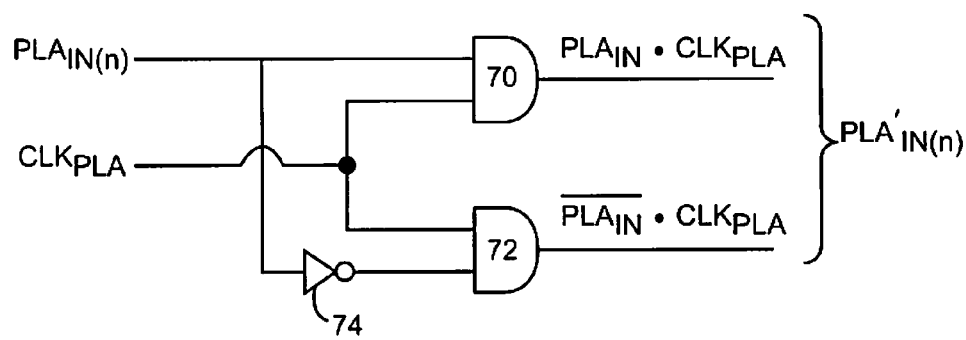
FIG. 6 is an input buffer architecture according to a first embodiment of the present invention.

As indicated above, one of the aspects of the present invention is to AND a PLA input signal $PLA_{IN}$ (actual or complement) with the PLA clock $CLK_{PLA}$. With reference to FIG. 6, an exemplary input buffer is provided, wherein a PLA input signal $PLA_{IN(n)}$ or its complement is ANDED with the PLA clock $CLK_{PLA}$ to provide an appropriate output signal for use in the dual NAND blocks 40. In operation, the PLA clock signal $CLK_{PLA}$ is provided to a first AND gate 70 and a second AND gate 72. In addition, a PLA input signal $PLA_{IN(n)}$ is delivered to the first AND gate 70 and inverted by an inverter 74 before being presented to the second AND gate 72. As such, the output of the first AND gate 70 is effectively the (uncomplemented) PLA input signal $PLA_{IN(n)}$ ANDED with the PLA clock signal $CLK_{PLA}$. The output of the second AND gate 72 is effectively the complement of the PLA input $PLA_{IN(n)}$ ANDED with the PLA clock signal $CLK_{PLA}$. Either output may be selected depending on the logic being implemented by the NAND-NOR PLA structure.

Figure 7:
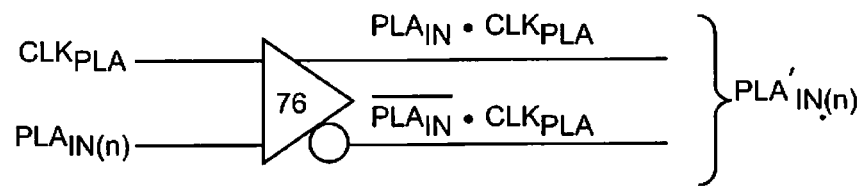
FIG. 7 is an input buffer architecture according to a second embodiment of the present invention.
Figure 8:
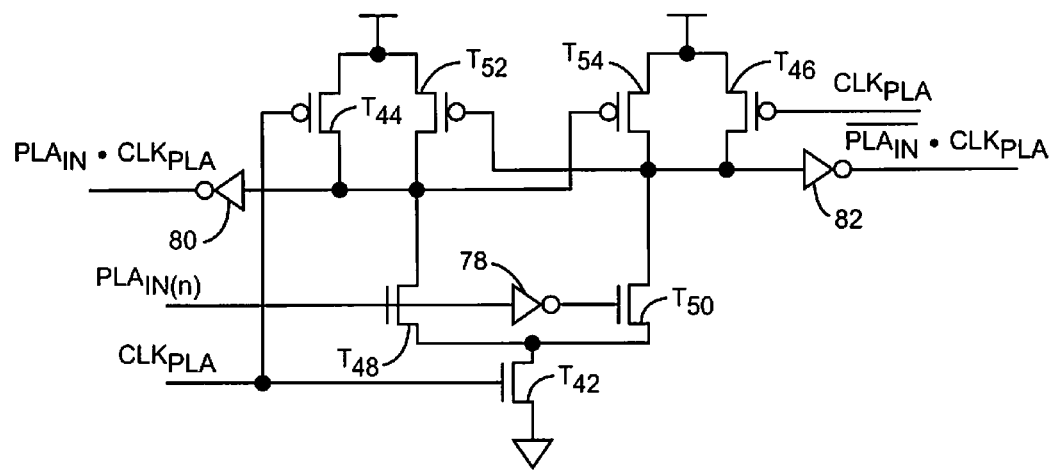
FIG. 8 is a detailed circuit diagram for the input buffer of FIG. 7.
Figure 10A:
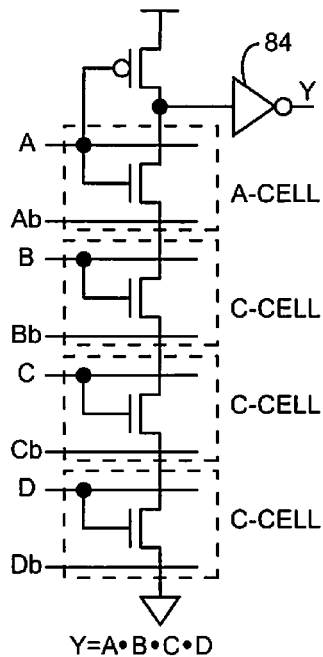
FIGS. 10A-10F illustrate six exemplary logic functions using the basic AND plane cells illustrated in FIGS. 9A-9G.
Figure 10B:
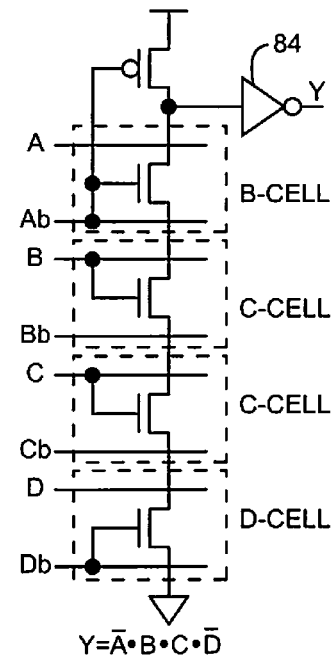
Figure 10C:
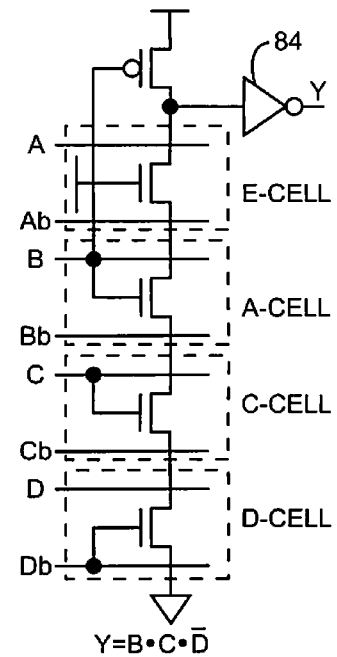
Figure 10D:
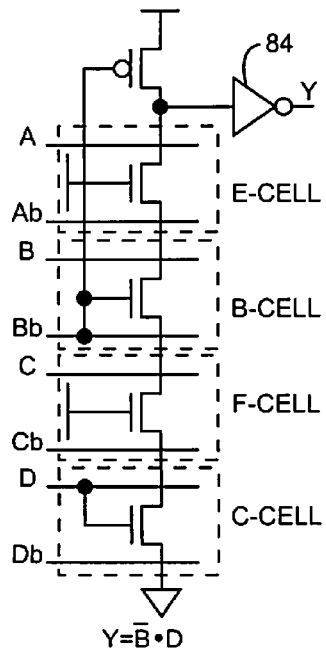
Figure 10E:
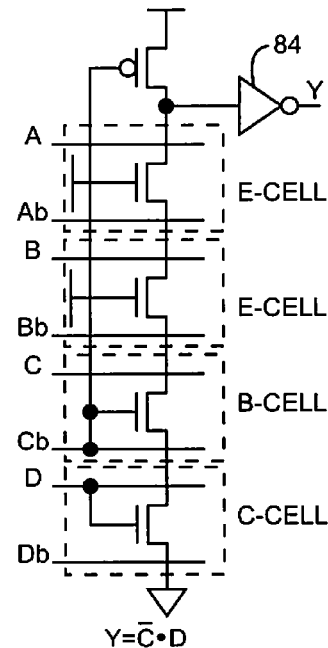
Figure 10F:
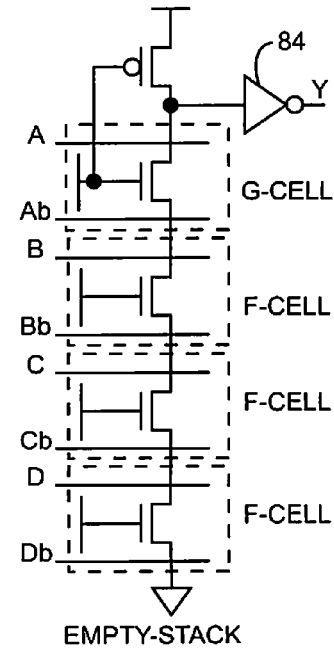

The same functionality provided by the input buffer of FIG. 6 can be provided with a differential input 76, as illustrated in FIG. 7. FIG. 8 illustrates a logical breakdown of the differential input buffer of FIG. 7. The PLA clock $CLK_{PLA}$ is used to drive the gates of NMOS transistor $T_{42}$, PMOS transistor $T_{44}$, and PMOS transistor $T_{46}$. The PLA input signal $PLA_{IN(n)}$ drives the gate of NMOS transistor $T_{48}$ and the input of inverter 78, the output of which drives the gate of NMOS transistor $T_{50}$. The sources of transistors $T_{48}$ and $T_{50}$ are coupled to the drain of transistor $T_{42}$. The drain of transistor $T_{48}$ is coupled to the drains of PMOS transistors $T_{44}$ and $T_{52}$, as well as the gate of PMOS transistor $T_{54}$. The drain of transistor $T_{48}$ also drives the input of inverter 80. In complementary fashion, the drain of transistor $T_{50}$ is coupled to the drains of transistors $T_{46}$ and $T_{54}$ and the gate of transistor $T_{52}$. The drain of transistor $T_{50}$ also drives the input of inverter 82.

When the PLA clock $CLK_{PLA}$ is low, the outputs of inverters 80 and 82 are low, because transistors $T_{44}$ and $T_{46}$ are turned on, which drives the inputs of the inverters 80 and 82 high. When the PLA clock $CLK_{PLA}$ goes high, transistor $T_{42}$ turns on, and transistors $T_{44}$ and $T_{46}$ turn off. As such, the sources of transistors $T_{48}$ and $T_{50}$ are pulled to ground. Transistors $T_{48}$ and $T_{50}$ will either remain off or turn on, depending on the value of the PLA input signal $PLA_{IN(n)}$. Regardless of state, one of the transistors $T_{48}$ and $T_{50}$ will be turned on. If the PLA input signal $PLA_{IN(n)}$ is high, transistor $T_{48}$ will turn on, which will drive the gate of transistor $T_{54}$ low. The result is driving the input of inverter 82 high and forcing the output of inverter 82 low. In contrast, when transistor $T_{48}$ is turned on, its drain is pulled low, which will drive the output of the inverter 80 high. Thus, during high clock cycles of the PLA clock $CLK_{PLA}$, the output of inverter 82 is the complement of the PLA input signal $PLA_{IN(n)}$ ANDED with the PLA clock $CLK_{PLA}$, while the output of inverter 80 is the PLA input signal $PLA_{IN(n)}$ ANDED with the PLA clock signal $CLK_{PLA}$. The differential input buffer of FIG. 8 is an efficient design; however, those skilled in the art will recognize other ways to provide the same functionality to assist in generating the dual NAND blocks 40 for the first stage 36 of the AND plane 32.

As indicated above, the dual NAND blocks 40, 40' of any of the various stages, including the first stage 36 and the second stage 38 of the AND plane 32, will include NAND stacks, such as the top and bottom NAND stacks 44 and 46 of the dual NAND block 40. Each one of the series-connected transistors in a given NAND stack may be referred to as a cell, and such cells may have different configurations depending on the logic being implemented. FIGS. 9A-9G illustrate seven different cells that may be arranged in various fashions to facilitate desired logic functions. Each cell is labeled A-G merely for reference. Each cell is made up of an NMOS transistor having a drain and a source, which are respectively labeled "D" and "S." The gates of the NMOS transistors are not labeled, and may be connected to a first input "A," the complement of the first input "Ab," $V_{CC}$, or ground. The letters "PRE" represent a direct or indirect connection to pre-charge circuitry, and in the illustrated embodiments, to the gates of a pre-charge transistor $T_{18}$, $T_{19}$, $T_{26}$, or $T_{28}$. The drains D and sources S will be connected from one cell to another in series, wherein the source of the bottom cell is connected to ground, and the drain of the top cell is coupled to a NAND node N1, N2, N3, or N4.

In FIG. 9A, the A-cell illustrated is generally used at the top of a NAND stack, wherein the input A into the dual NAND block 40 is used to drive both the gate of the transistor in the A-cell as well as drive the pre-charge circuitry. In FIG. 9B, the B-cell illustrated is also generally used at the top of a NAND stack, wherein the input Ab into the dual NAND block 40 is used to drive both the gate of the transistor in the B-cell as well as drive the pre-charge circuitry. In FIG. 9C, the C-cell illustrated is generally used anywhere in the NAND stack, wherein the input A into the dual NAND block 40 is used to drive the gate of the transistor in the C-cell. In FIG. 9D, the D-cell illustrated is generally used anywhere in the NAND stack, wherein the input Ab into the dual NAND block 40 is used to drive the gate of the transistor in the D-cell.

The E-cell of FIG. 9E illustrates a cell wherein the gate is simply tied to $V_{CC}$, and a connection is provided to allow a cell above or below the E-cell in the NAND stack to provide a pre-charge connection to another cell or to pre-charge circuitry. The F-cell of FIG. 9F has a gate tied high, and does not provide the pre-charge circuitry connection. FIG. 9G provides a pre-charge connection between adjacent cells or pre-charge circuitry, as well as connecting the pre-charge connection and the gate of the transistor in the G-cell to $V_{CC}$.

FIGS. 9H and 9I illustrate cells that may be employed in a NOR gate 58 of the OR plane 34. In particular, FIG. 9H illustrates an unused 0-cell, wherein the gate of the transistor therein is tied to ground and the drain, which is generally connected to the output node $OR_{OUT(x)}$, is connected to the drains of other cells in the NOR gate 58. The 1-cell of FIG. 9I illustrates an active cell wherein the input (IN) that drives the gate of the transistor in the 1-cell is connected directly or indirectly to the AND plane output signal $AND_{OUT}$. Again, the drain of the transistor in the 1-cell is connected to the output node $OR_{OUT(x)}$ of the NOR gate 58.

With reference to FIGS. 10A-10F, various NAND stack configurations are illustrated, wherein each NAND stack employs four of the AND plane cells illustrated in FIGS. 9A-9G to implement the identified logic functions. Please keep in mind that the NAND stacks effectively provide a NAND function, which drives the input of inverter 84 to provide an output Y. Thus, the overall logic function illustrated is an AND function. For the input of the inverter 84 to be low, all of the cells in the NAND stack must be on. When each of the cells is on and the inputs to the inverters are pulled low, the output of the inverter 84 goes high. Notably, the inverter 84 may form part of the NOR gates 48, 52, in the dual NAND blocks 40, 40'.

Figure 11:
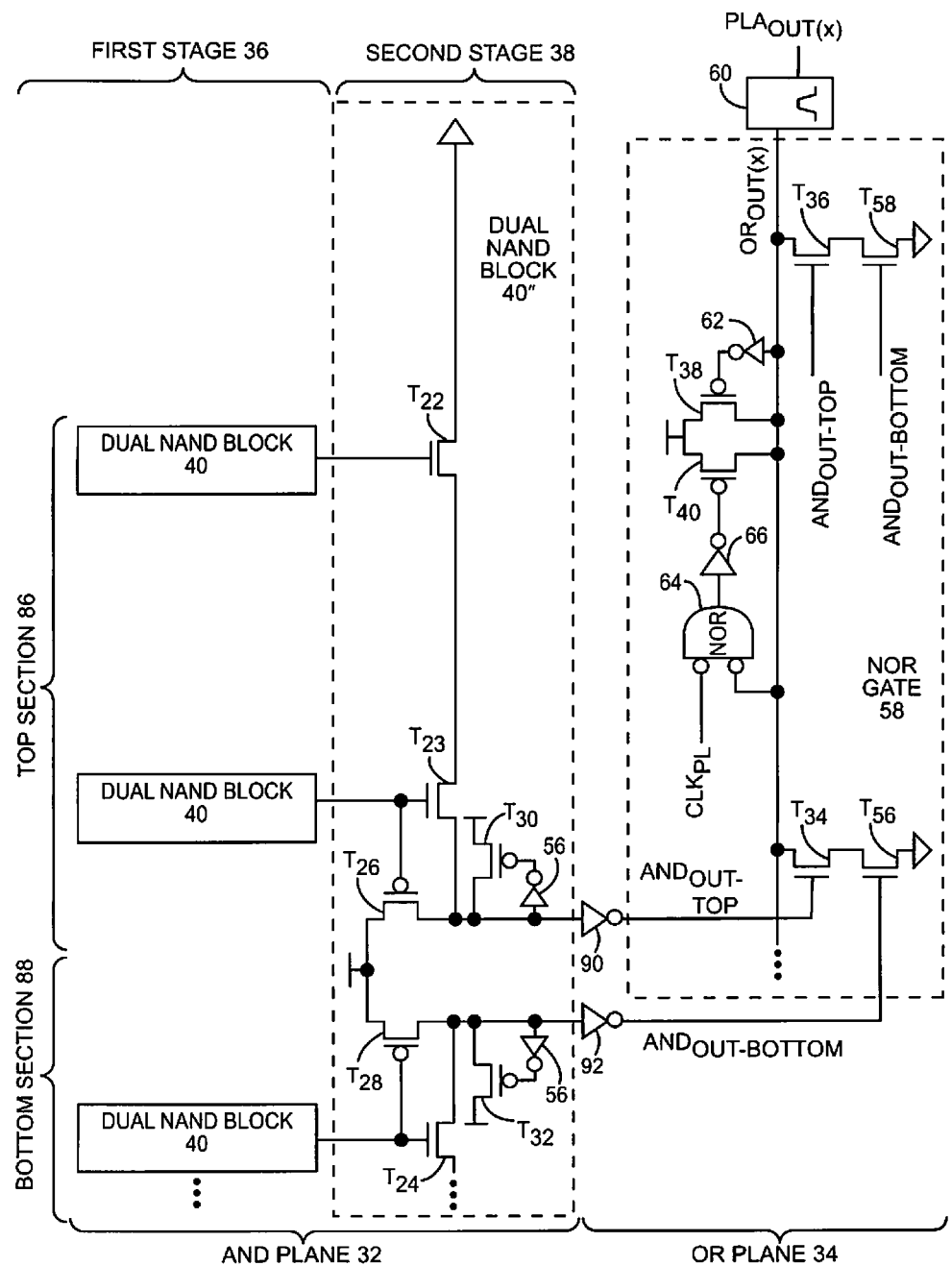
FIG. 11 illustrates a NAND-NOR PLA structure according to a second embodiment of the present invention.

With reference to FIG. 11, another embodiment of the present invention is illustrated. In this embodiment, the AND plane 32 is further broken into at least a top section 86 and a bottom section 88. Those skilled in the art will recognize that additional sections may be employed while still remaining within the concepts of the present invention. The primary division in the AND plane 32 is in the second stage 38. In particular, the NOR gate 52 of FIG. 4 is removed, and nodes N3 and N4 drive inverters 90 and 92, respectively. As such, each dual NAND block 40" of the second stage 38 provides two output signals, a top AND plane output signal $AND_{OUT-TOP}$, and a bottom AND plane output signal $AND_{OUT-BOTTOM}$. Each of these signals drives a transistor in a two-transistor NAND stack, which makes up the NOR gate 58. The two NAND stacks in the NOR gate 58 that are depicted are represented by the transistor pair $T_{34}$ and $T_{56}$, as well as the transistor pair $T_{36}$ and $T_{58}$. Each transistor pair $T_{34}/T_{56}$ and $T_{36}/T_{58}$ will be driven by top and bottom AND plane output signals from different portions of the AND plane 32. To pull the output node $OR_{OUT(x)}$ low, both the top and bottom AND plane output signals $AND_{OUT-TOP}$ and $AND_{OUT-BOTTOM}$ for a given NAND stack must be driven high. For example, when the gates of transistors $T_{34}$ and $T_{56}$ are driven high at the same time, the output node $OR_{OUT(x)}$ is pulled low, and the latch 60 can latch the state of the output node $OR_{OUT(x)}$ and provide it as a PLA output signal $PLA_{OUT(x)}$. Those skilled in the art will recognize that NAND blocks 40, 40' are scalable and may have any number of inputs. Further, the number of NAND blocks 40, 40' may vary from one application to another.

With the presence of the inverters 90, 92, and the stacking arrangement for the transistors that make up the NOR gate 58, a logical AND of the top and bottom sections 86, 88 of the AND plane 32 is provided. The keeper and pre-charge circuitries operate in similar fashions to the embodiment of FIG. 4. Dividing the AND plane 32 into multiple sections and having the output of those sections drive different transistors in a NAND stack of the NOR gate 58 significantly reduces the leakage current at the output node $OR_{OUT(x)}$ high when none of the NAND stacks within the NOR gate 58 are asserted. As with the prior embodiment, no race conditions are present.

Figure 12:
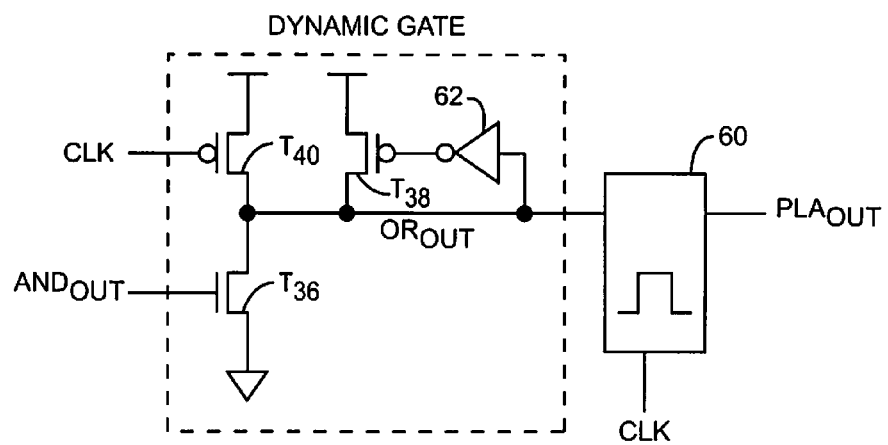
FIG. 12 illustrates a dynamic gate architecture and a clock signal for driving a latch circuit according to one embodiment of the prior art.

The latch 60 depicted in the embodiments of FIGS. 4 and 11 may be configured in different ways. FIG. 12 represents a scaled-down section of the NOR gate 58, wherein transistor $T_{36}$ is driven by the AND plane output signal $AND_{OUT}$ to effectively control the output node $OR_{OUT}$. A system clock, CLK, which may be PLA clock $CLK_{PLA}$ or a function thereof, drives the gate of the pre-charge transistor $T_{40}$ as well as controls latching of the latch 60. Transistor $T_{38}$ and inverter 62, as described above, function to maintain the output node $OR_{OUT}$ high when the AND plane output signal $AND_{OUT}$ is low. As such, the clock signal CLK effectively enables the dynamic NOR gate 58, as well as the latch 60, as is conventionally done. Notably, the latch 60 is an active-high latch, meaning that the latch is effectively transparent while the clock CLK is high. Preferably, the latch 60 may open after the output node $OR_{OUT(x)}$ has the value to be latched.

Figure 13:
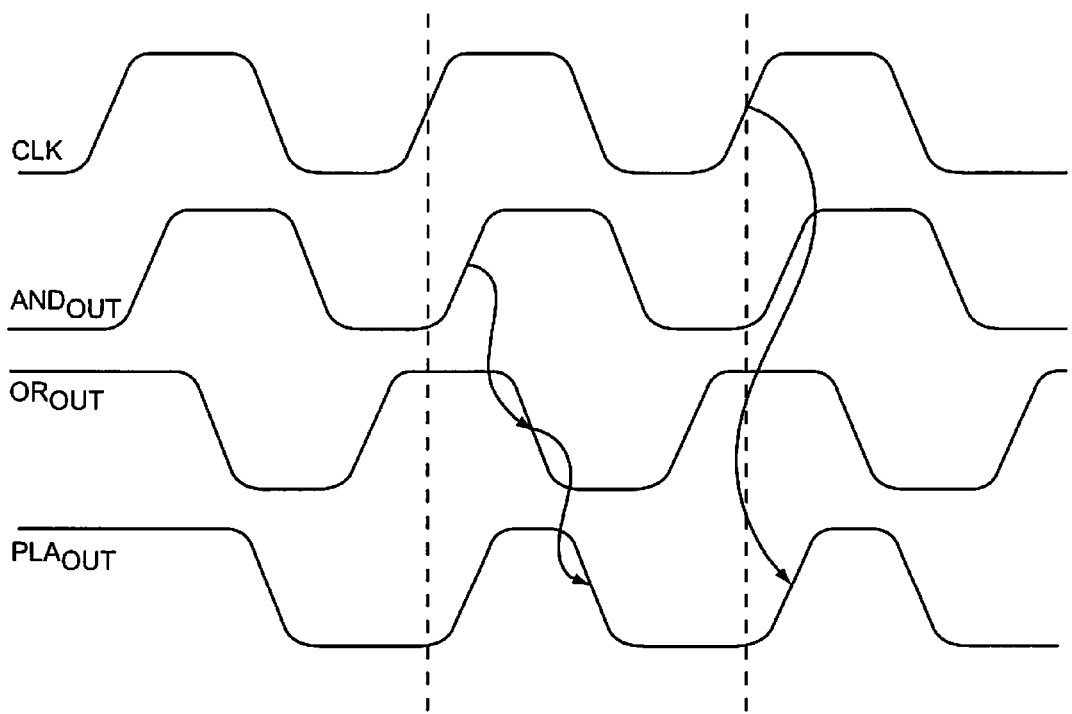
FIG. 13 is a timing diagram illustrating operation of the circuitry of FIG. 12.

The timing diagram of FIG. 13 shows the transition at the output node $OR_{OUT}$ and the PLA output signal $PLA_{OUT}$ corresponding to the clock CLK and the AND plane output signal $AND_{OUT}$. When the clock CLK is low, the output node $OR_{OUT}$ is high and is in the charged state. When the clock CLK is high, the AND plane output signal $AND_{OUT}$ is evaluated and the output node $OR_{OUT}$ becomes the complement of the AND plane output signal $AND_{OUT}$. If the resulting value of the output node $OR_{OUT}$ is not latched by the latch 60, the result will be lost in a subsequent pre-charging phase of the output node $OR_{OUT}$.

The rising edges, E1 and E2, of FIG. 13 mark the boundaries of one clock cycle. When the clock CLK is high, the latch 60 is transparent, and as is evident from FIG. 13, the pre-charged high value of the output node $OR_{OUT}$ is passed through the latch 60 when the latch 60 opens. When the AND plane output signal $AND_{OUT}$ switches from a low to a high, the output node $OR_{OUT}$ discharges, and subsequently, the following edge is passed through the latch 60. As such, the output of latch 60 makes two transitions, a low to a high, and a high to a low, within a single clock phase, giving rise to an activity factor of two for the output of the latch 60. Again, the output of the latch 60 is the PLA output signal $PLA_{OUT}$. This high activity factor of any dynamic gate is propagated to downstream logic, resulting in increased overall power dissipation, even if the following logic is static.

Figure 14:
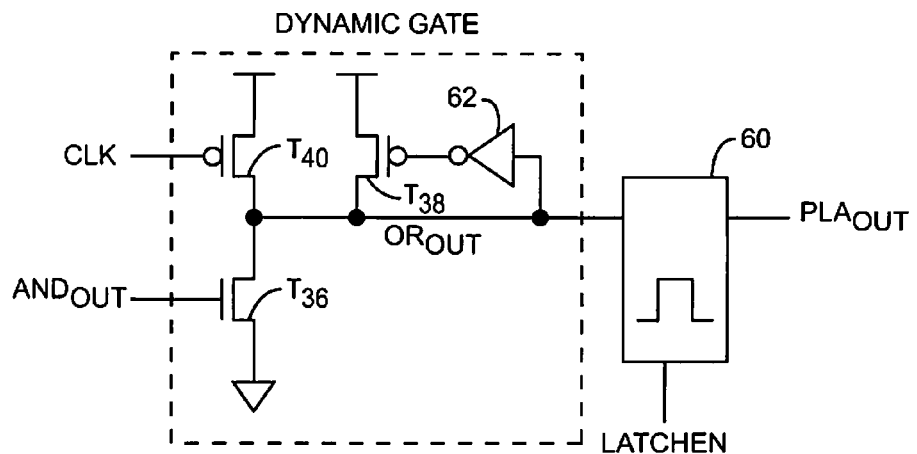
FIG. 14 illustrates a dynamic gate architecture and a latch enable signal for driving a latch circuit according to one embodiment of the present invention.

Turning now to FIG. 14, an improved latching technique is provided. In particular, a system clock CLK, which is essentially derived from the PLA clock $CLK_{PLA}$ if it isn't the PLA clock $CLK_{PLA}$ itself, is used to drive the pre-charge transistor $T_{40}$, and thus enable the dynamic gate. In contrast with FIG. 12, a separate latch enable signal LATCHEN is used to control the active-high latch 60. In comparison to the clock CLK, the active portion of the latch enable signal LATCHEN is shorter and is activated only after the dynamic gate has effectively evaluated the AND plane output signal $AND_{OUT}$. With this embodiment, the unnecessary power dissipation due to the high activity factor associated with dynamic gates such as that illustrated in FIG. 13 can be eliminated if the latch enable LATCHEN, which is generated after the dynamic gate has completed its evaluation, is used instead of the clock CLK, which controls the evaluation state of the dynamic gate.

Figure 15:
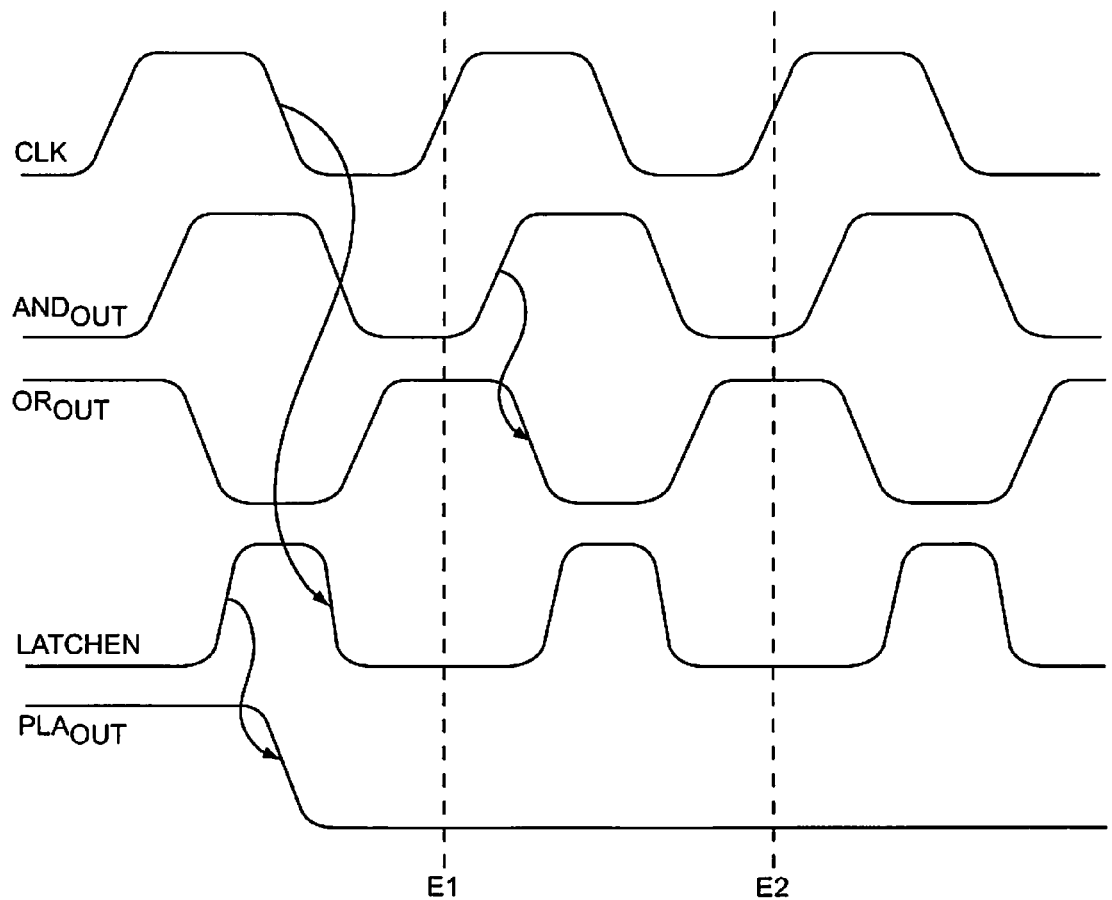
FIG. 15 is a timing diagram illustrating operation of the circuitry of FIG. 14.

The timing diagram of FIG. 15 illustrates that the extra transition of PLA output signal $PLA_{OUT}$ that occurred between edges E1 and E1 in FIG. 13 is eliminated in FIG. 15. The activity factor associated with the PLA output signal $PLA_{OUT}$ is therefore similar to that of a static gate, and the reduced activity factor helps to lower the power dissipation in downstream logic. In a preferred embodiment, this latch enabling technique is employed in the embodiments of FIGS. 4 and 11. For the system to provide the reduced power dissipation, the active portion of the latch enable signal LATCHEN should be shorter than the clock CLK, and asserted high after the AND plane output signals $AND_{OUT}$ have been evaluated. If a race condition is created at the latch 60, there is no concern for failure. If the race is lost and the latch enable signal LATCHEN occurs early, the power dissipation is merely increased, and the overall functionality of the circuit simply reverts back to that of FIG. 12. Thus, the circuit remains fully operational and immune to failures due to races with clocking signals.

Those skilled in the art will recognize improvements and modifications to the preferred embodiments of the present invention. All such improvements and modifications are considered within the scope of the concepts disclosed herein and the claims that follow.

What is claimed is:

1. A programmable logic array (PLA) comprising:
   an AND plane implemented with NAND logic and adapted to receive a plurality of PLA input signals and provide at least one AND plane output signal, wherein the NAND logic comprises a hierarchical arrangement of a plurality of NAND logic blocks in a plurality of stages such that a first stage comprises at least two NAND logic blocks, which receive the plurality of PLA input signals, and a final stage comprises at least one NAND logic block, which receives output signals from a prior stage and provides the at least one AND plane output signal;
   an OR plane adapted to receive the at least one AND plane output signal and provide an OR plane output signal; and
   a latch circuit adapted to latch the OR plane output signal as a PLA output signal.

2. The programmable logic array of claim 1 wherein the prior stage is the first stage.

3. The programmable logic array of claim 1 wherein at least one of the plurality of NAND logic blocks comprises a first NAND transistor stack of a first plurality of series-connected input transistors coupled between a first node and ground, each of the first plurality of series-connected input transistors having a transistor input available to receive at least one of a group consisting of one of the plurality of PLA input signals and one of the output signals from the prior stage.

4. The programmable logic array of claim 3 wherein the at least one of the plurality of NAND logic blocks further comprises a second NAND transistor stack of a second plurality of series-connected input transistors coupled between a second node and ground, each of the second plurality of series-connected input transistors having a transistor input available to receive at least one of the group consisting of one of the plurality of PLA input signals and one of the output signals from the prior stage.

5. The programmable logic array of claim 4 further comprising a logic gate having at least two inputs coupled to the first node and the second node and adapted to provide one of the output signals based on logic levels of the first node and the second node.

6. The programmable logic array of claim 5 wherein the logic gate is adapted to provide a NOR logic function.

7. The programmable logic array of claim 5 wherein the one of the output signals is the at least one AND plane output signal.

8. The programmable logic array of claim 5 wherein the one of the output signals is one of the output signals from the prior stage.

9. The programmable logic array of claim 3 wherein the at least one of the plurality of NAND logic blocks comprises a pre-charge circuit coupled to the first node and adapted to charge the first node to a logic high when the first NAND transistor stack is not active.

10. The programmable logic array of claim 9 wherein a control input of the pre-charge circuit is coupled to the transistor input of one of the first plurality of series-connected input transistors, such that the at least one of the group consisting of one of the plurality of PLA input signals and one of the output signals from the prior stage drives the control input of the pre-charge circuit and the transistor input of the one of the first plurality of series-connected input transistors.

11. The programmable logic array of claim 10 wherein the one of the first plurality of series-connected input transistors is coupled between the first node and another transistor in the first plurality of series-connected input transistors.

12. The programmable logic array of claim 9 wherein when one of the first plurality of series-connected input transistors is turned on and the first NAND transistor stack is active, the pre-charge circuit is turned off.

13. The programmable logic array of claim 1 further comprising input circuitry adapted to generate a product of a PLA clock signal and either an initial input signal or a complement of the initial input signal to provide each one of the plurality of PLA input signals.

14. The programmable logic array of claim 13 wherein a latch enable signal is derived from the PLA clock signal and configured to have an asserted cycle:
   that is less than that of the PLA clock signal; and
   that is provided to the latch circuit after the OR plane has evaluated the at least one AND plane output signal.

15. The programmable logic array of claim 13 wherein the input circuitry is a differential input circuit adapted to receive the PLA clock signal and the initial input signal and generate the product of the PLA clock signal and either the initial input signal or the complement of the initial input signal to provide each one of the plurality of PLA input signals.

16. The programmable logic array of claim 1 wherein the OR plane is activated directly from the at least one AND plane output signal.

17. A programmable logic array (PLA) comprising:
   an AND plane implemented with NAND logic and adapted to receive a plurality of PLA input signals and provide at least one AND plane output signal, the AND plane comprising a plurality of parallel NAND sections such that one of the at least one AND plane output signal is provided by each of the plurality of parallel NAND sections and is used to drive a corresponding one of a plurality of series-connected transistors in an at least one transistor stack;

an OR plane adapted to receive the at least one AND plane output signal and provide an OR plane output signal, the OR plane comprising an output node providing the OR plane output signal and at least one transistor stack coupled to the output node and comprising a plurality of series-connected transistors; and a latch circuit adapted to latch the OR plane output signal as a PLA output signal.

18. The programmable logic array of claim 17 further comprising input circuitry adapted to generate a product of a PLA clock signal and either an initial input signal or a complement of the initial input signal to provide each one of the plurality of PLA input signals.

19. The programmable logic array of claim 1 wherein the latch circuit is timed to open after the OR plane output signal reaches the latch circuit.

20. The programmable logic array of claim 1 wherein the NAND logic is provided by a plurality of dynamic logic gates configured to provide a NAND logic function.

21. The programmable logic array of claim 1 wherein the OR plane is implemented by NOR logic and the NOR logic is provided by a plurality of dynamic logic gates configured to provide a NOR logic function.

22. The programmable logic array of claim 1 wherein the OR plane does not include footer transistors.

23. The programmable logic array of claim 1 wherein the AND plane does not include footer transistors.

* * * * *